US006767837B2

(12) United States Patent
Sun et al.

(10) Patent No.: US 6,767,837 B2
(45) Date of Patent: Jul. 27, 2004

(54) ETCH-BACK METHOD FOR DIELECTRIC LAYER

(75) Inventors: Yu-Chi Sun, Taoyuan (TW); Tse-Yao Huang, Taipei (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/379,969

(22) Filed: Mar. 5, 2003

(65) Prior Publication Data

US 2004/0063317 A1 Apr. 1, 2004

(30) Foreign Application Priority Data

Oct. 1, 2002 (TW) ........................................ 91122611 A

(51) Int. Cl.[7] ............................................ H01L 21/302
(52) U.S. Cl. ........................ 438/714; 438/697; 438/723
(58) Field of Search ............................. 438/697, 714, 438/722, 723, 724, 725, 719, 720

(56) References Cited

U.S. PATENT DOCUMENTS

| 5,792,705 | A | * | 8/1998 | Wang et al. | 438/624 |
|---|---|---|---|---|---|
| 6,265,315 | B1 | * | 7/2001 | Lee et al. | 438/692 |
| 6,479,399 | B2 | * | 11/2002 | Park et al. | 438/738 |
| 2002/0045353 | A1 | * | 4/2002 | Kang | 438/710 |
| 2003/0045099 | A1 | * | 3/2003 | Sun et al. | 438/689 |

* cited by examiner

Primary Examiner—George A. Goudreau
(74) Attorney, Agent, or Firm—Quintero Law Office

(57) ABSTRACT

A method of inter-layer dielectric (ILD) or inter-metal dielectric (IMD) planarization. Reactive ion etching (RIE) is performed with gases including equal amounts of $C_5F_8$ and $CHF_3$, and argon diluent gas. The ratio of the gas is precisely controlled in the etching, and once the oxygen drops, the etching process enters deposition of the protection layer, and when oxygen concentration drops to a minimum level, the etch-back process stops automatically. Higher ILD or IMD uniformity is achieved compared with conventional CMP process.

27 Claims, 2 Drawing Sheets

ETCH-BACK METHOD FOR DIELECTRIC LAYER

BACKGROUND OF THE INVENTION

1. Field of the Invention

The present invention relates to a method of dielectric planarization. More particularly, it relates to an etch-back method of an inter-layer dielectric (ILD) or an inter-metal dielectric (IMD) planarization.

2. Description of the Related Art

Presently, a popular trend in integrated circuits (ICs) are ICs with high integration, wherein more and more dielectric or metal layers are integrated on a substrate to form devices, affecting the overall uniformity of the substrate. Substrates with poor uniformity encounter poor resolution or insufficient depth of focus (DOF) in subsequent photolithography.

In conventional ICs fabrication, devices such as MOS transistors or patterned metal lines are formed on a substrate first, a layer of dielectric is deposited on and between the devices, and another metal layer is then deposited. The dielectric layer used as an insulating layer between metal lines and devices is referred to as an inter-layer dielectric (ILD), with the dielectric layer used as an insulating layer between metal lines in different layers referred to as an inter-metal dielectric (IMD).

The ILD or IMD dielectric layer is conventionally a silica-based oxide layer, such as silicon dioxide or doped silicon dioxide, e.g. BSG, BPSG or PSG, or oxygen-containing low-k dielectric materials, e.g. SiOC or SiOF, developed recently.

The deposited dielectric layer conforms to the patterned substrate, so conventional chemical mechanical polishing (CMP) is performed to planarize the surface of the dielectric layer, and then a planarized dielectric layer on the substrate is provided and subsequent photolithography can be easily performed.

FIGS. 1 & 2 are cross sections of inter-layer dielectric (ILD) devices on a substrate before and after CMP planarization. In FIG. 1, a substrate 10, for example, silicon, is provided with a plurality of devices D is in a dense area 20 and in a sparse area 40 on the substrate 10. Devices D are maybe MOS transistors, capacitors or other logic devices, and the surfaces of devices D are an oxygen-free material, such as silicon nitride ($Si_3N_4$), poly-silicon, amorphous silicon, metal or metal nitride. A dielectric layer 12 is formed, blanketing on and between devices D in areas 20 and 40. The dielectric layer 12 is made of an oxygen-containing material, such as silicon dioxide, doped silicon dioxide (for example, BSG, BPSG or PSG), or oxygen-containing low-k materials (for example, SiOC or SiOF). The formed dielectric layer 12 with a thickness exceeding the height of devices D is taken as an inter-layer dielectric (ILD) between devices D to insulate the devices D from each other.

In FIG. 2, a conventional chemical mechanical polishing (CMP) process achieves overall planarization of the ILD layer 12. Due to frequent difficulties in determining the end-point of the polishing process, the dishing in sparse area 40 occurs, as does over-polishing in the dense area 20, and the conformation and structure of the devices D maybe damaged. After CMP, the planarized ILD layer 12 has a thickness difference H1 between 300~800 angstrom in the dense area 20 and the sparse area 40. The uniformity of the planarized ILD layer 12 in FIG. 2 is thus poor, and the results of planarization are affected.

Thus, an ILD layer may be formed on a substrate with devices unequally spaced thereon, wherein spacing is dense in some areas, and sparser in others. When CMP is performed to planarize the ILD layer on the substrate, dishing often occurs in the sparsely populated areas. In the densely populated areas, overpolishing caused by the dishing also occurs, possibly damaging the device. Thus, after CMP, the ILD layer is usually left with a thickness difference of 300 angstroms above or below the devices nearby (the maximum can be even 1600 angstroms). The overall uniformity of the ILD layer after CMP is poor, with the surface of the ILD layer not planarized.

Hence, there is a need for a better method to solve the uniformity issue after planarization.

SUMMARY OF THE INVENTION

Accordingly, an object of the invention is to provide an etch-back method for the dielectric layer planarization that results in better surface uniformity.

Etching gases often contain the fluorocarbon compound ($C_XF_Y$), from the $CF_4$-containing etching gas used in the past to the $C_2F_6$- or $C_3F_8$-containing gases used recently as a source of carbon atoms and fluorine atoms. During etching of silicon dioxide, oxygen atoms are formed as byproducts of the etching process. Once the ambient concentration of oxygen atoms drops, the etching process is near the end, and the end-point of the etching process can be determined by monitoring the concentration of the oxygen atoms through the sensors attached to an etching apparatus.

Generally speaking, two phases occur during dry etching, etching, and deposition. In the etching phase, the etched parts are driven out, and in deposition, a protection layer is deposited to prevent subsequent etching.

Another object of the etch-back method of the invention is to precisely control the ratio of the etching gas (mainly $C_5F_8$ and $CHF_3$ in the invention). In the process, when devices or patterned metal lines on a substrate are still covered by oxygen-containing ILD or IMD, the concentration of oxygen remains steady, and the process is still in the etching phase. When the material covering the devices or the patterned metal lines is etched out and the devices and the metal lines are exposed, the concentration of oxygen atoms drops, the etching enters the deposition phase, and a layer of hydrofluorocarbon polymer with a thickness within a hundred angstroms is deposited as a protection layer. The deposition rate of the protection layer is balanced to the decreasing oxygen concentration. Once the oxygen concentration decreases, the reaction enters the deposition phase, and finally the oxygen concentration is low enough that etching stops automatically.

The process of ILD planarization of the invention comprises providing a substrate with devices formed in varying areas of density, forming a blanket dielectric layer between and on the devices in all areas, and performing a reactive ion etching (RIE) such that the dielectric layer is etched with a gas comprising $C_5F_8$ and $CHF_3$, stopping on the devices, such that, finally, a uniform dielectric layer is provided.

The process of IMD planarization of the invention comprises providing a substrate with a plurality of patterned metal lines thereon, forming a blanket dielectric layer between and on the metal lines, and reactive ion etching (RIE) at a pressure between 35~85 milliTorr with operating AC power between 1100~1900 W applied. The dielectric layer is etched with a gas comprising $C_5F_8$ and $CHF_3$, stopping on the devices, such that a uniform dielectric layer is provided between the patterned metal lines in all areas.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
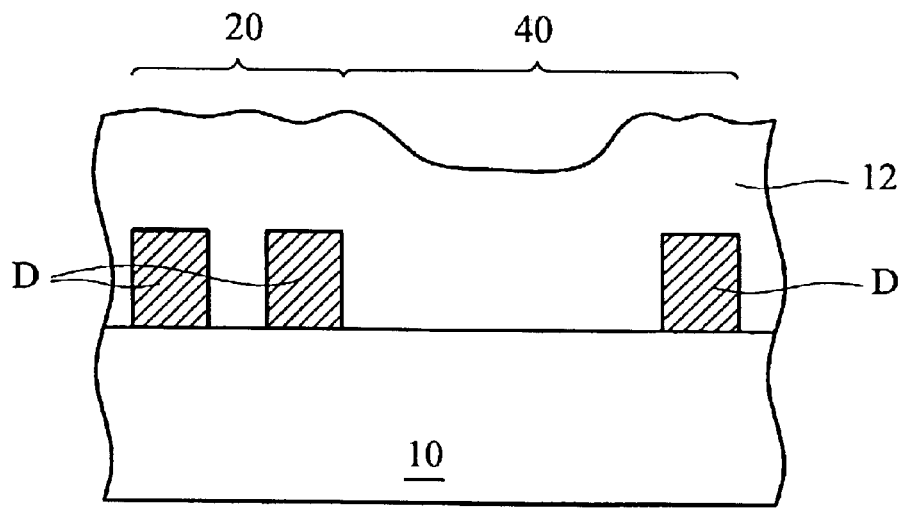
FIG. 1 is a cross section of ILD with devices thereon formed on a substrate before CMP planarization as referenced in the Prior Art.
Figure 2:
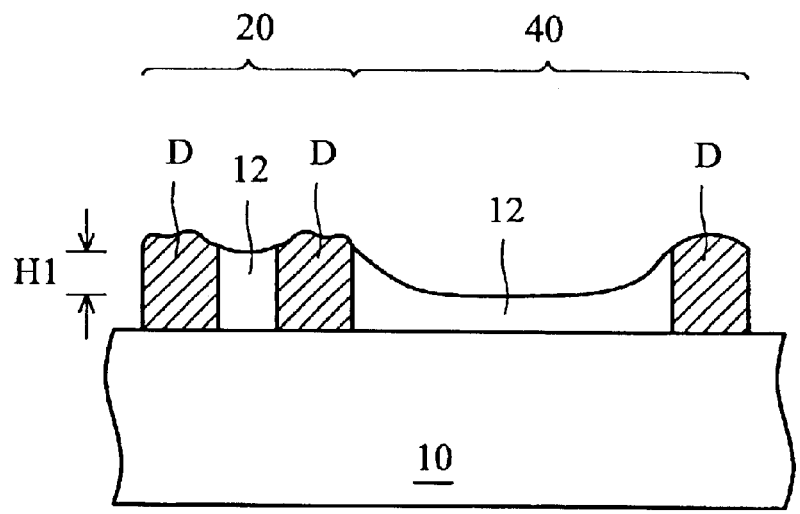
FIG. 2 is a cross section of ILD with devices thereon formed on a substrate after the CMP planarization in the Prior Art.
Figure 3:
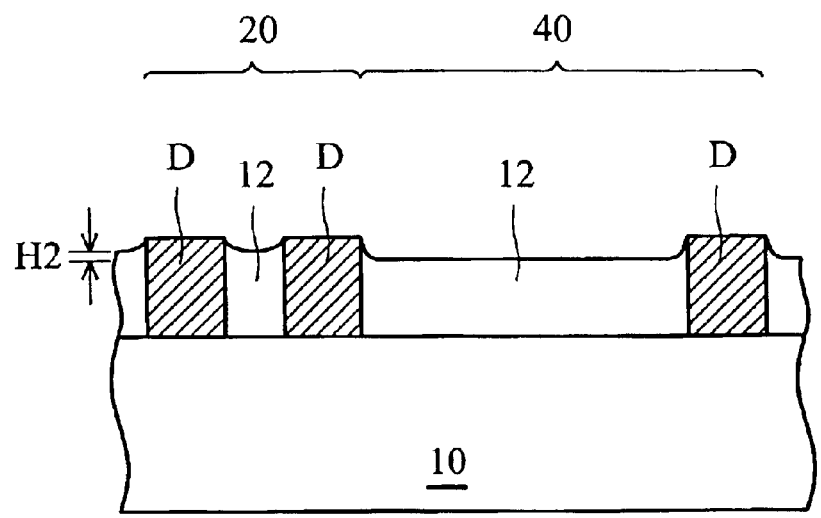
FIG. 3 is a cross section of ILD with devices thereon formed on a substrate after the etch-back planarization as referenced in the invention.

In FIG. 3, etch-back in accordance with the present invention, such as RIE, is performed. The gases in the etching process include equal amounts of $C_5F_8$ and $CHF_3$, and argon diluent gas. The flow ratio of the $C_5F_8$ and $CHF_3$ is about 10.5:10, wherein the flow rate of $C_5F_8$ is between 9~10.5 sccm, the flow rate of $CHF_3$ is between 9~10 sccm and the gas flow rate of argon is between 400~800 sccm. The operating AC power of the process is between 1100~1900 W, and the operating pressure of the process is between 35~85 milliTorr. Then etch-back planarization is performed and the ILD layer 12 illustrated in FIG. 1 is etched under the conditions and by the etching gases mentioned above and oxygen byproduct is formed from the etched oxygen-containing ILD layer 12, and the oxygen concentration is maintained in a steady concentration during the etching process. When the ILD layer 12 above the devices D is etched out and surfaces of devices D are exposed, the oxygen concentration drops and a layer of hydrofluorocarbon polymer (not shown) with a thickness less than a hundred angstrom is deposited as a protection layer. During the etch-back process of the invention, the rate of oxygen generation compromises with the rate of the protection layer formed, and once the oxygen concentration drops, the reaction enters the deposition phase, and when the oxygen concentration drops to a minimum level, the etch-back process stops automatically. Using the etch-back method to planarize the ILD layer 12, the thickness differences H2 of the ILD layer 12 in the densely populated area 20 and in the sparsely populated area 40 are reduced to under 100 angstroms or less, such that the planarized ILD layer 12 here has better uniformity.

Figure 4:
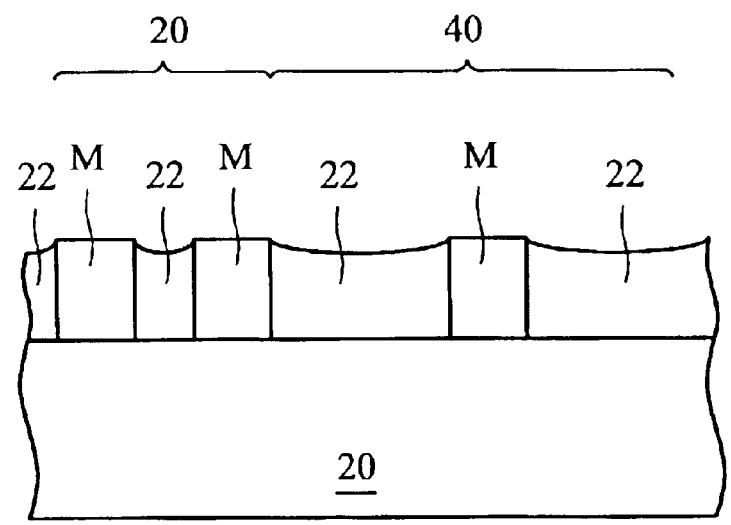
FIG. 4 is a cross section of an inter-metal dielectric (IMD) with metal lines formed on a substrate after the etch-back planarization as referenced in the invention.

Furthermore, the etch-back method of the invention is also suitable for the planarization of the IMD layer. In FIG. 4, a substrate 20, for example a silicon substrate, with a plurality of patterned metal lines M is also performed in a densely populated area 20 and in a sparsely populated area 40 on the substrate 20, and the metal lines M are aluminum (Al), tungsten (W), Copper (Cu), or a bilayered film of a metal and it's nitride (for example Ti/TiN). Then a dielectric layer 22 is formed on and between metal lines M. The dielectric layer 22 is an oxygen-containing material, e.g. silicon dioxide, doped silicon dioxide (for example, BSG, BPSG or PSG), or oxygen-containing low-k materials (for example, SiOC or SiOF). The formed dielectric layer 22 with a thickness less than the height of the metal lines is taken as an inter-metal dielectric (IMD) between metal lines M to insulate the metal lines M from each other.

RIE is performed with gases including equal amounts of $C_5F_8$ and $CHF_3$, and argon diluent gas. The flow ratio of the $C_5F_8$ and $CHF_3$ is about 10.5:10, the flow rate of $C_5F_8$ is between 9~10.5 sccm, the flow rate of $CHF_3$ is between 9~10 sccm and the gas flow rate of argon is between 400~800 sccm. The operating AC power of the process is between 1100~1900 W, and the operating pressure of the process is between 35~85 milliTorr. Etch-back planarization is performed and the IMD layer 22 is etched under the conditions and with the etching gases mentioned, and oxygen byproduct is formed from the etched oxygen-containing IMD layer 22 so the oxygen concentration is maintained at a steady concentration during the etching process. When the IMD layer 22 above the metal lines M is etched out and surfaces of the metal lines M are exposed, the oxygen concentration drops and a layer of hydrofluorocarbon polymer (not shown) with a thickness less than a hundred angstrom is deposited as a protection layer. During the etch-back process of the invention, the rate of oxygen decrease is equal to the rate of the protection layer formed, and once the oxygen concentration drops, the reaction enters the deposition phase of the protection layer, and then when oxygen concentration drops to a minimum level, the etch-back process stops automatically. Using the etch-back method to planarize the IMD layer 22, the planarized ILD layer 22 here has a better uniformity than with the metal CMP process in the Prior Art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An etch-back method for dielectric layer, comprising:
   providing a substrate with devices formed in varying areas of density;
   forming a blanket dielectric layer between and on the devices in all areas; and
   performing a reactive ion etch(RIE) process, thereby etching the dielectric layer with etching gas comprising $C_5F_8$ and $CHF_3$, and stopping on the devices, such that a uniform dielectric layer is provided between the devices in all areas.

2. The method as claimed in claim 1, wherein the surfaces of the devices are an oxygen-free material.

3. The method as claimed in claim 2, wherein the oxygen-free material is silicon nitride (Si3N4), poly-silicon, amorphous silicon, metal or metal nitrides.

4. The method as claimed in claim 1, wherein the dielectric layer is an oxygen-containing material.

5. The method as claimed in claim 4, wherein the oxygen-containing material is silicon dioxide, doped silicon dioxide or oxygen-containing low-k dielectric materials.

6. The method as claimed in claim 1, wherein a flow ratio of the $C_5F_8$ to the flow of the $CHF_3$ is about 10.5:10.

7. The method as claimed in claim 1, wherein $C_5F_8$ has a flow rate between 9~10.5 sccm, and $CHF_3$ has a flow rate between 9~10 sccm.

8. The method as claimed in claim 1, wherein the dielectric layer is an inter-layer dielectric (ILD).

9. The method as claimed in claim 1, wherein the etching gas further comprises argon.

10. The method as claimed in claim 9, wherein the argon has a flow rate between 400~800 sccm.

11. An etch-back method for dielectric layer, comprising:

providing a substrate with devices formed in varying areas of density;

forming a blanket dielectric layer between and on the devices in all areas; and applying a reactive ion etch (RIE) process at a processing pressure of 35~85 milliTorr and operating AC power between 1100~1900 W, etching the dielectric layer with a etching gas comprising $C_5F_8$ and $CHF_3$, and stopping on the devices, thereby providing a uniform dielectric layer between the devices in all areas.

12. The method as claimed in claim 11, wherein the surfaces of the devices are an oxygen-free material.

13. The method as claimed in claim 12, wherein the oxygen-free material is silicon nitride ($Si_3N_4$), poly-silicon, amorphous silicon, metal or metal nitrides.

14. The method as claimed in claim 11, wherein the dielectric layer is an oxygen-containing material.

15. The method as claimed in claim 14, wherein the oxygen-containing material is silicon dioxide, doped silicon dioxide or oxygen-containing low-k dielectric materials.

16. The method as claimed in claim 11, wherein a flow ratio of the $C_5F_8$ to the flow of the $CHF_3$ is about 10.5:10.

17. The method as claimed in claim 11, wherein $C_5F_8$ has a flow rate between 9~10.5 sccm, and $CHF_3$ has a flow rate between 9~10 sccm.

18. The method as claimed in claim 11, wherein the dielectric layer is an inter-layer dielectric (ILD).

19. The etch-back method for dielectric layer as claimed in claim 11, wherein the etching gas further comprising argon with a flow rate between 400~800 sccm.

20. An etch-back method for dielectric layer, comprising:

providing a substrate with a plurality of patterned metal lines thereon;

forming a blanket dielectric layer between and on the metal lines; and applying a reactive ion etch (RIE) process at a processing pressure between 35~85 milliTorr and operating AC power between 1100~1900 W, etching the dielectric layer with a etching gas comprising $C_5F_8$ and $CHF_3$, and stopping on the devices, thereby providing a uniform dielectric layer between patterned metal lines in all areas.

21. The method as claimed in claim 20, wherein the metal lines are aluminum (Al), copper (Cu), tungsten (W) or a bi-layered film of a metal and nitrides thereof.

22. The method as claimed in claim 20, wherein the dielectric layer is an oxygen-containing material.

23. The method as claimed in claim 22, wherein the oxygen-containing material is silicon dioxide, doped silicon dioxide or the oxygen-containing low-k dielectric materials.

24. The method as claimed in claim 20, wherein a flow ratio of the $C_5F_8$ to the flow of the $CHF_3$ is about 10.5:10.

25. The method as claimed in claim 20, wherein $C_5F_8$ has a flow rate between 9~10.5 sccm, and $CHF_3$ has a flow rate between 9~10 sccm.

26. The method as claimed in claim 20, wherein the dielectric layer is an inter-metal dielectric (IMD).

27. The method as claimed in claim 20, wherein the etching gas further comprising argon with a flow rate among 400~800 sccm.

* * * * *